(12) United States Patent
Morita et al.

(10) Patent No.: US 7,527,871 B2
(45) Date of Patent: *May 5, 2009

(54) CURABLE ORGANOPOLYSILOXANE COMPOSITION AND SEMICONDUCTOR DEVICE

(75) Inventors: Yoshitsugu Morita, Chiba Prefecture (JP); Masayoshi Terada, Chiba Prefecture (JP); Hiroji Enami, Chiba Prefecture (JP); Tomoko Kato, Chiba Prefecture (JP)

(73) Assignee: Dow Corning Toray Company, Ltd., Tokyo (JP)

( * ) Notice: Subject to any disclaimer, the term of this patent is extended or adjusted under 35 U.S.C. 154(b) by 399 days.

This patent is subject to a terminal disclaimer.

(21) Appl. No.: 10/573,505

(22) PCT Filed: Sep. 14, 2004

(86) PCT No.: PCT/JP2004/013724

§ 371 (c)(1),
(2), (4) Date: Mar. 27, 2006

(87) PCT Pub. No.: WO2005/033207

PCT Pub. Date: Apr. 14, 2005

(65) Prior Publication Data

US 2007/0112147 A1    May 17, 2007

(30) Foreign Application Priority Data

Oct. 1, 2003    (JP)    .............................. 2003-343622

(51) Int. Cl.
*B32B 9/04* (2006.01)
*C08L 83/04* (2006.01)
(52) U.S. Cl. ...................... 428/447; 525/477; 525/478; 528/15; 528/31; 528/32
(58) Field of Classification Search ........................ None
See application file for complete search history.

(56) References Cited

U.S. PATENT DOCUMENTS 6,001,943 A * 12/1999 Enami et al. ................. 528/15
7,153,914 B2 * 12/2006 Staiger et al. ................ 525/478
7,282,270 B2 * 10/2007 Morita et al. ................ 428/447
2004/0241927 A1   12/2004 Kato et al.
2006/0207646 A1 *  9/2006 Terreau et al. ............... 136/251

FOREIGN PATENT DOCUMENTS

| JP | 8-176447 | 7/1996 |
| JP | 11-001619 | 1/1999 |
| JP | 2003-128922 | 5/2003 |
| WO | WO 01/17570 | 3/2001 |
| WO | WO 2004/037927 A1 * | 5/2004 |

OTHER PUBLICATIONS

English language Abstract for JP 8-176447 extracted from espacenet.com database dated Mar. 10, 2006.
English language Abstract for JP11-001619 extracted from espacenet.com database dated Mar. 10, 2006.
English language Abstract for JP 2003-128922 extracted from espacenet.com database dated Mar. 10, 2006.

* cited by examiner

*Primary Examiner*—Marc S Zimmer
(74) *Attorney, Agent, or Firm*—Howard & Howard Attorneys PLLC

(57) ABSTRACT

A curable organopolysiloxane composition comprising (A) a linear organopolysiloxane having at least two alkenyl groups and at least one aryl group per molecule, (B) a branched organopolysiloxane having at least one alkenyl group and at least one aryl group per molecule, and having siloxane units represented by the general formula: $RSiO_{2/3}$, (C) a linear organopolysiloxane with both terminal ends of the molecular chain blocked by silicon bonded hydrogen atoms having at least one aryl group per molecule, and (D) a hydrosilation reaction catalyst, and a semiconductor device whose semiconductor elements are coated with the cured product of the above-described composition. The curable organopolysiloxane composition shows low viscosity, excellent filling properties, and excellent curability that cures to form a soft cured product of a large refractive index, high light transmittance, and high adhesion to substrates, as well as the semiconductor device shows superior reliability.

12 Claims, 1 Drawing Sheet

CURABLE ORGANOPOLYSILOXANE COMPOSITION AND SEMICONDUCTOR DEVICE

TECHNICAL FIELD

The present invention relates to a curable organopolysiloxane composition and a semiconductor device, and, more specifically, relates to a curable organopolysiloxane composition of low viscosity, excellent filling properties, and excellent curability that cures to form a soft cured product of a large refractive index, high light transmittance, and high adhesion to substrates, as well as to a semiconductor device of superior reliability, whose semiconductor elements are coated with the cured product of the above-mentioned composition.

BACKGROUND ART

Curable organopolysiloxane compositions curable by the hydrosilation reaction are used as protective coating materials for semiconductor elements in optical semiconductor devices such as photocouplers, light-emitting diodes, solid-state image pickup elements, etc. For the above-mentioned elements to emit light or receive light, it is required that such protective coating materials for semiconductor elements should not absorb light or scatter it.

A curable organopolysiloxane composition comprising an organopolysiloxane containing silicon bonded phenyl groups and silicon bonded alkenyl groups, an organohydrogencyclosiloxane, and a hydrosilation reaction catalyst (refer to Japanese Laid-Open (Kokai or Unexamined) Patent Application Number Hei 8-176447 (176447/1996)); a curable organopolysiloxane composition comprising a solid or liquid organopolysiloxane with a viscosity of 10,000 cp and above at 25° C., and containing silicon bonded phenyl groups and silicon bonded alkenyl groups, an organohydrogenpolysiloxane having at least two silicon bonded hydrogen atoms per molecule, and a hydrosilation reaction catalyst (refer to Japanese Laid-Open (Kokai or Unexamined) Patent Application Number Hei 11-1619 (1619/1999)); and a curable organopolysiloxane composition comprising an organopolysiloxane having at least two alkenyl groups bonded to silicon atoms per molecule and having aryl groups bonded to silicon atoms, an organopolysiloxane having at least two hydrogen atoms bonded to silicon atoms per molecule, and a complex of platinum and an aryl-containing organosiloxane oligomer (refer to Japanese Laid-Open (Kokai or Unexamined) Patent Application Number 2003-128922 (128922/2003)) are suggested as examples of the curable organopolysiloxane compositions that can be cured by the hydrosilation reaction to form cured products of a large refractive index and high light transmittance.

However, the problem was that these curable organopolysiloxane compositions had high viscosity, poor filling properties, or formed cured products with poor adhesive properties that easily peeled off substrates.

It is an object of the present invention to provide a curable organopolysiloxane composition of low viscosity, excellent filling properties, and excellent curability that cures to form a soft cured product of a large refractive index, high light transmittance, and high adhesion to substrates, as well as a semiconductor device of superior reliability, whose semiconductor elements are coated with the cured product of the above-mentioned composition.

DISCLOSURE OF INVENTION

The curable organopolysiloxane composition of the present invention is characterized by comprising;
- (A) a linear organopolysiloxane having at least two silicon bonded alkenyl groups and at least one silicon bonded aryl group per molecule,
- (B) a branched organopolysiloxane having at least one silicon bonded alkenyl group and at least one silicon bonded aryl group per molecule, and having siloxane units represented by the general formula: $RSiO_{3/2}$ (where R is a substituted or unsubstituted monovalent hydrocarbon group) {in an amount necessary for a weight ratio of from 1/99 to 99/1 relative to component (A)},
- (C) a linear organopolysiloxane with both terminal ends of the molecular chain blocked by silicon bonded hydrogen atoms having at least one silicon bonded aryl group per molecule {in an amount necessary to provide 1 to 200 parts by weight relative to 100 parts by weight of the total of component (A) and component (B)}, and
- (D) a hydrosilation reaction catalyst (in an amount necessary to promote the curing of the present composition).

In addition, the semiconductor device of the present invention is characterized in that its semiconductor elements are coated with a cured product of the above-described curable organopolysiloxane composition.

EFFECTS OF INVENTION

The curable organopolysiloxane composition of the present invention is characterized by low viscosity, excellent filling properties, and excellent curability, and by curing to form a soft cured product of a large refractive index, high light transmittance, and high adhesion to substrates.

In addition, the semiconductor device of the present invention is characterized by superior reliability because its semiconductor elements are coated with a cured product of the above-mentioned composition.

REFERENCE NUMBERS

Figure 1:
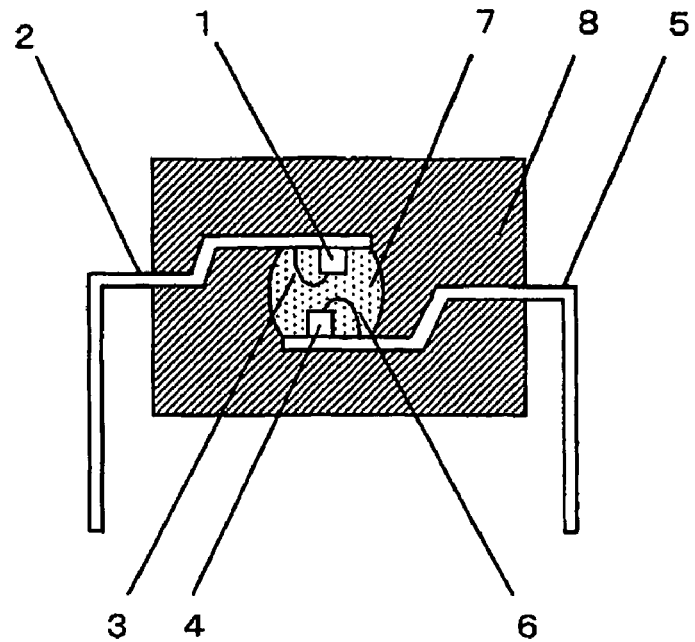
FIG. 1 contains a cross-sectional view of a photocoupler as an example of the semiconductor device of the present invention.

1: Semiconductor element
2: Lead frame
3: Bonding wire
4: Semiconductor element
5: Lead frame
6: Bonding wire
7: Cured product of the curable organopolysiloxane composition
8: Sealing resin
9: Semiconductor element
10: Lead frame
11: Lead frame 12: Bonding wire
13: Cured product of the curable organopolysiloxane composition
14: Transparent sealing resin

DETAILED DESCRIPTION OF THE INVENTION

First of all, explanations will be provided regarding the curable organopolysiloxane composition of the present invention.

Component (A), which is the major component of the composition, is a linear organopolysiloxane having at least two silicon bonded alkenyl groups and at least one silicon bonded aryl group per molecule. The alkenyl groups of component (A) are exemplified by vinyl, allyl, butenyl, pentenyl, and hexenyl, with vinyl being particularly preferable. In addition, the aryl groups of component (A) are exemplified by phenyl, tolyl, xylyl, and naphthyl, with phenyl being particularly preferable. In addition, silicon bonded organic groups of component (A) other than the alkenyl and aryl groups are substituted or unsubstituted hydrocarbon groups, examples of which include methyl, ethyl, propyl, butyl, pentyl, hexyl, heptyl, and other alkyl groups; benzyl and phenethyl, and other aralkyl groups; and halogenated alkyl groups such as chloromethyl, 3-chloropropyl, and 3,3,3-trifluoropropyl, with methyl being particularly preferable. Achieving low attenuation due to light refraction, reflection, scattering etc. in the cured product obtained by curing the composition requires that the content of the silicon bonded aryl groups among all the silicon bonded organic groups in component (A) should be not less than 40 mol %, and, particularly preferably, not less than 45 mol %. Although there are no limitations concerning the viscosity of component (A) at 25° C., it is preferably in the range of from 10 to 1,000,000 mPa·s, and, especially preferably, in the range of from 100 to 50,000 mPa·s. This is due to the fact that when the viscosity of component (A) is below the lower limit of the above-mentioned range, the mechanical strength of the resultant cured product tends to decrease, and, on the other hand, when it exceeds the upper limit of the above-mentioned range, the handling properties of the resultant composition tend to deteriorate.

An organopolysiloxane represented by the general formula:

[Formula 1]

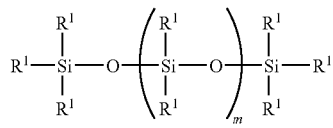

is preferable as component (A). In the formula above, $R^1$ is a substituted or unsubstituted monovalent hydrocarbon group more specifically exemplified by the above-mentioned alkyl groups, the above-mentioned alkenyl groups, the above-mentioned aryl groups, the above-mentioned aralkyl groups, and the above-mentioned halogenated alkyl groups. However, at least two $R^1$ per molecule must be the above-mentioned alkenyl groups and at least one $R^1$ per molecule must be one of the above-mentioned aryl groups. Also, in the formula above, <<m>> is an integer of 5 to 1,000, and, preferably, an integer such that the viscosity of the organopolysiloxane at 25° C. stays in the range of from 10 to 1,000,000 mPa·s, and especially preferably, in the range of from 100 to 50,000 mPa·s.

Component (B), which is used to impart strength to the cured product obtained by curing the present composition, is a branched organopolysiloxane having at least one silicon bonded alkenyl group and at least one silicon bonded aryl group per molecule, and having siloxane units represented by the general formula $RSiO_{3/2}$. The alkenyl groups of component (B) are exemplified by the same groups as those mentioned above, with vinyl being particularly preferable. The aryl groups of component (B) are exemplified by the same groups as those mentioned above, with phenyl being particularly preferable. In addition, silicon bonded organic groups of component (B) other than the alkenyl and aryl groups are exemplified by substituted or unsubstituted monovalent hydrocarbon groups such as the above-mentioned alkyl groups, the above-mentioned aralkyl groups, the above-mentioned halogenated alkyl groups, etc., with methyl being especially preferable. In the siloxane units of component (B) represented by the general formula $RSiO_{3/2}$, R stands for a substituted or unsubstituted monovalent hydrocarbon group more specifically exemplified by the above-mentioned alkyl groups, the above-mentioned alkenyl groups, the above-mentioned aryl groups, the above-mentioned aralkyl groups, and the above-mentioned halogenated alkyl groups, with the above-mentioned alkyl groups and the above-mentioned aryl groups being particularly preferable.

An organopolysiloxane represented by the average unit formula:

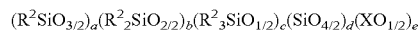

is preferable as component (B). In the formula above, $R^2$ is a substituted or unsubstituted monovalent hydrocarbon group more specifically exemplified by the above-mentioned alkyl groups, the above-mentioned alkenyl groups, the above-mentioned aryl groups, the above-mentioned aralkyl groups, and the above-mentioned halogenated alkyl groups. Here, 0.1 to 40 mol % of $R^2$ per molecule are preferably the above-mentioned alkenyl groups. This is due to the fact that when the content of the alkenyl groups is below the lower limit of the above-mentioned range, its reactivity with component (C) tends to decrease, and, on the other hand, even when it exceeds the upper limit of the above-mentioned range, its reactivity with component (C) also tends to decrease. Also, achieving low attenuation due to light refraction, reflection, scattering etc. in the cured product obtained by curing the present composition requires that not less than 10 mol % of $R^2$ should be the above-mentioned aryl groups, and, in particular, in siloxane units represented by the general formula $R^2SiO_{3/2}$, it is preferable that not less than 30 mol % of $R^2$ should be represented by the above-mentioned aryl groups, with $R^2$ other than the alkenyl and aryl groups being preferably represented by methyl groups. In addition, in the formula above, <<a>> is a positive number, <<b>> is 0 or a positive number, <<c>> is 0 or a positive number, <<d>> is 0 or a positive number, <<e>> is 0 or a positive number, <<b/a>> is number between 0 and 10, <<c/a>> is a number between 0 and 0.5, <<d/(a+b+c+d)>> is a number between 0 and 0.3, and <<e/(a+b+c+d)>> is a number between 0 and 0.4. Although there are no limitations concerning the molecular weight of component (B), when converted to standard polystyrene, its weight-average molecular weight (Mw) should preferably be in the range of from 500 to 10,000, and, especially preferably, in the range of from 700 to 3,000.

The content of component (B) is such that the weight ratio of component (B) to component (A) {weight of component (B)/weight of component (A)} is in the range of from 1/99 to 99/1, preferably, in the range of from 10/90 to 70/30. This is due to the fact that when the content of component (B) is less than the lower limit of the above-mentioned range, the strength of the resultant cured product tends to decrease, and, on the other hand, when it exceeds the upper limit of the above-mentioned range, the handling properties of the resultant composition deteriorate and the resultant cured product tends to be extremely hard.

Component (C), which is the curing agent of the present composition, is a linear organopolysiloxane with both terminal ends of the molecular chain blocked by silicon bonded hydrogen atoms having at least one silicon bonded aryl group per molecule. The aryl groups of component (C) are exemplified by the same groups as those mentioned above, with phenyl being especially preferable. In addition, silicon bonded organic groups of component (C) other than the aryl groups are exemplified by substituted or unsubstituted monovalent hydrocarbon groups with the exception of alkenyl groups, such as the above-mentioned alkyl groups, the above-mentioned aralkyl groups, and the above-mentioned halogenated alkyl groups, with methyl being particularly preferable. Achieving low attenuation due to light refraction, reflection, scattering etc. in the cured product obtained by curing the composition requires that the content of the silicon bonded aryl groups among all the silicon bonded organic groups in component (C) should be not less than 15 mol % and, particularly preferably, not less than 30 mol %. Although there are no limitations concerning the viscosity of component (C) at 25° C., it is preferably in the range of from 1 to 1,000 mPa·s, and, especially preferably, in the range of from 2 to 500 mPa·s. This is due to the fact that when the viscosity of component (C) is below the lower limit of the above-mentioned range, it may tend to volatilize and the makeup of the resultant composition may be unstable, and, on the other hand, when it exceeds the upper limit of the above-mentioned range, the handling properties of the resultant composition tend to deteriorate.

An organopolysiloxane represented by the general formula:

[Formula 2]

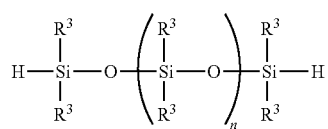

is preferable as component (C). In the formula above, $R^3$ is a hydrogen atom or a substituted or unsubstituted monovalent hydrocarbon group with the exception of alkenyl groups. The monovalent hydrocarbon groups of $R^3$ are specifically exemplified by the above-mentioned alkyl groups, the above-mentioned aryl groups, and the above-mentioned halogenated alkyl groups. Here, at least one $R^3$ per molecule must be one of the above-mentioned aryl groups, preferably, phenyl. In addition, <<n>> in the formula above is an integer of 1 or more, preferably, an integer in the range of from 1 to 20, and, especially preferably, an integer in the range of from 1 to 10. This is due to the fact that when the value of <<n>> exceeds the upper limit of the above-mentioned range, the filling properties of the resultant composition, or the adhesive properties of the cured product, tend to deteriorate.

The content of component (C) is an amount necessary to provide 1 to 200 parts by weight, preferably, 1 to 100 parts by weight, and especially preferably, 1 to 50 parts by weight relative to 100 parts by weight of the total of component (A) and component (B). This is due to the fact that when the content of component (C) is below the lower limit of the above-mentioned range, the resultant composition tends to fail to completely cure, and, on the other hand, when it exceeds the upper limit of the above-mentioned range, the heat resistance of the resultant cured product tends to deteriorate. In addition, for the above-described reasons, the content of component (C) is preferably an amount necessary to keep the amount of silicon bonded hydrogen atoms provided by this component in the range, of from 0.1 to 10 mol, preferably, in the range of from 0.1 to 5 mol, and especially preferably, in the range of from 0.5 to 2 mol per 1 mol of all the alkenyl groups contained in component (A) and component (B).

The hydrosilation reaction catalyst of component (D) is a catalyst used to promote the reaction of the alkenyl groups of component (A) and component (B) with the silicon bonded hydrogen atoms of component (C). Component (D) is exemplified by platinum catalysts, rhodium catalysts, and palladium catalysts, with platinum catalysts being preferable because of their ability to significantly stimulate the cure of the present composition. The platinum catalysts are exemplified by platinum micropowder, chloroplatinic acid, alcohol solutions of chloroplatinic acid, platinum/alkenylsiloxane complexes, platinum/olefin complexes, and platinum/carbonyl complexes, with platinum/alkenylsiloxane complexes being particularly preferable. The alkenylsiloxanes are exemplified by 1,3-divinyl-1,1,3,3-tetramethyldisiloxane, 1,3,5,7-tetramethyl-1,3,5,7-tetravinylcyclotetrasiloxane, alkenylsiloxanes obtained by substituting groups such as ethyl, phenyl etc. for some of the methyl groups of the above-mentioned alkenylsiloxanes, and alkenylsiloxanes obtained by substituting groups such as allyl, hexenyl, etc. for the vinyl groups of the above-mentioned alkenylsiloxanes. Using 1,3-divinyl-1,1,3,3-tetramethyldisiloxane is particularly preferable because of the excellent stability of the platinum/alkenylsiloxane complex. Also, due to the improvement in the stability of the complex that their addition may bring, it is desirable to add 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinylcyclotetrasiloxane and other alkenylsiloxanes and organosiloxane oligomers such as dimethylsiloxane oligomers to the platinum/alkenylsiloxane complex, with alkenylsiloxanes being particularly preferable.

There are no limitations on the content of component (D) as long as the amount promotes the curing of the present composition. However, speaking more specifically, in the present composition, it is preferable to use it in such a quantity that the amount of metal atoms contained in this component, in weight units, stays in the range of from 0.01 to 500 ppm, more preferably, in the range of from 0.01 to 100 ppm, and especially preferably, in the range of from 0.01 to 50 ppm. This is due to the fact that when the content of component (D) is below the lower limit of the above-mentioned range, the present composition tends to fail to completely cure, and, on the other hand, when it exceeds the upper limit of the above-mentioned range, problems may arise in terms imparting various colors to the resultant cured product.

In addition to the curing agent of component (C), (E) an organopolysiloxane with at least two silicon bonded hydrogen atoms per molecule can be added to the present composition as an optional curing agent. However, component (E) can be anything except for the same organopolysiloxane as the above-described component (C). The silicon bonded organic groups of component (E) are exemplified by substituted or unsubstituted monovalent hydrocarbon groups with the exception of alkenyl groups, such as the above-mentioned alkyl groups, the above-mentioned aryl groups, the above-mentioned aralkyl groups, and the above-mentioned halogenated alkyl groups, with the above-mentioned alkyl groups and the above-mentioned aryl groups being particularly preferable. There are no limitations concerning the consistency of component (E), but at 25° C. the component can be either liquid or solid, with liquid being particularly preferable.

The molecular structure of component (E) is exemplified by linear, partially branched linear, branched, and network structures, with branched structures being preferable from the standpoint of imparting more strength to the cured product obtained by curing the present composition. Such branched organopolysiloxanes are preferably organopolysiloxanes represented by the average unit formula:

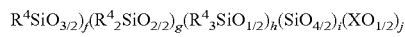

$(R^4SiO_{3/2})_f(R^4{}_2SiO_{2/2})_g(R^4{}_3SiO_{1/2})_h(SiO_{4/2})_i(XO_{1/2})_j$

In the formula above, $R^4$ is a hydrogen atom or a substituted or unsubstituted monovalent hydrocarbon group with the exception of alkenyl groups. The monovalent hydrocarbon groups of $R^4$ are exemplified by the above-mentioned alkyl groups, the above-mentioned aryl groups, the above-mentioned aralkyl groups, and the above-mentioned halogenated alkyl groups. Here, 0.1 to 40 mol % of $R^4$ per molecule are preferably hydrogen atoms. This is due to the fact that when the content of silicon bonded hydrogen atoms is below the lower limit of the above-mentioned range, it becomes difficult to completely cure the present composition, and, on the other hand, when it exceeds the upper limit of the above-mentioned range, the heat resistance of the resultant cured product tends to deteriorate. In addition, achieving low attenuation due to light refraction, reflection, scattering etc. in the cured product obtained by curing the composition requires that not less than 10 mol % of $R^4$ should be the above-mentioned aryl groups, and, in particular, in siloxane units represented by the general formula $R^4SiO_{3/2}$, it is preferable that not less than 30 mol % of $R^4$ should be represented by the above-mentioned aryl groups, with $R^4$ other than the aryl groups being preferably represented by methyl groups. Also, in the formula above, X is a hydrogen atom or an alkyl group exemplified by the same groups as those mentioned above, with methyl being particularly preferable. In addition, in the formula above, <<f>> is a positive number, <<g>> is 0 or a positive number, <<h>> is 0 or a positive number, <<i>> is 0 or a positive number, <<j>> is 0 or a positive number, <<g/f>> is a number between 0 and 10, <<h/f>> is a number between 0 and 5.0, <<i/(f+g+h+i)>> is a number between 0 and 0.3, and <<j/(f+g+h+i)>> is a number between 0 and 0.4. Although there are no limitations concerning the molecular weight of component (E), when converted to standard polystyrene, its weight-average molecular weight (Mw) should preferably be in the range of from 300 to 10,000, and, especially preferably, in the range of from 500 to 3,000.

When component (E) is included in the present composition, the content of component (E) is preferably in the range of from 0.1 to 50 wt % relative to the total of component (C) and component (E). This is due to the fact that when the content of component (E) is below the lower limit of the above-mentioned range, the strength of the cured produce obtained by curing the composition tends to decrease, and, on the other hand, when it exceeds the upper limit of the above-mentioned range, the curability of the resultant composition deteriorates and the adhesive properties of the cured produced obtained by curing the composition with respect to substrates tend to deteriorate as well.

The present composition may contain 2-methyl-3-butyn-2-ol, 3,5-dimethyl-1-hexyn-3-ol, 2-phenyl-3-butyn-2-ol and other alkyne alcohols; 3-methyl-3-penten-1-yne, 3,5-dimethyl-3-hexen-1-yne, and other ene-yne compounds; 1,3,5,7-tetramethyl-1,3,5,7-tetravinylcyclotetrasiloxane, 1,3,5,7-tetramethyl-1,3,5,7-tetrahexenylcyclotetrasiloxane, benzotriazole and other reaction inhibitors as other optional components. While there are no limitations concerning the content of such reaction inhibitors, it is preferably in the range of from 0.0001 to 5 parts by weight relative to 100 parts by weight of the total of component (A) and component (B).

In addition, the present composition may contain adhesion promoters in order to improve its adhesive properties. Such adhesion promoters are preferably organosilicon compounds having at least one silicon bonded alkoxy group per molecule. The alkoxy groups are exemplified by methoxy, ethoxy, propoxy, butoxy, and methoxyethoxy, with methoxy being particularly preferable. In addition, silicon bonded groups other than the alkoxy groups in these organosilicon compounds are exemplified by the above-mentioned alkyl groups, the above-mentioned alkenyl groups, the above-mentioned aryl groups, the above-mentioned aralkyl groups, the above-mentioned halogenated alkyl groups and other substituted and unsubstituted monovalent hydrocarbon groups; 3-glycidoxypropyl, 4-glycidoxybutyl, and other glycidoxy alkyl groups; 2-(3-4-epoxycyclohexyl)ethyl, 3-(3,4-epoxycyclohexyl)propyl, and other epoxycyclohexylalkyl groups; 4-oxiranyl-butyl, 8-oxiranyl-octyl, and other oxiranyl-alkyl groups, as well as other epoxy-containing monovalent organic groups; 3-methacryloxypropyl and other acryl-containing monovalent organic groups; and hydrogen atoms. The organosilicon compounds preferably have groups capable of reacting with component (A) and component (B) or component (C), more specifically, silicon bonded alkenyl groups or silicon bonded hydrogen atoms. In addition, in order to be able to impart excellent adhesion to various substrates, the organosilicon compounds preferably have at least one epoxy-containing monovalent organic group per molecule. Such organosilicon compounds are exemplified by organosilane compounds, organosiloxane oligomers, or alkyl silicates. The molecular structures of the organosiloxane oligomers or alkyl silicates are exemplified by linear, partially branched linear, branched, cyclic, and network structures, with linear, branched and network structures being particularly preferable. Such organosilicon compounds are exemplified by 3-glycidoxypropyltrimethoxysilane, 2-(3,4-poxycyclohexyl)ethyltrimethhoxysilane, 3-methacryloxypropyltrimethoxysilane, and other silane compounds; mixtures of siloxane compounds having at least one silicon bonded alkenyl group or one silicon bonded hydrogen atom and a silicon bonded alkoxy group per molecule, siloxane compounds or silane compounds having at least one silicon bonded alkoxy group, and siloxane compounds having at least one silicon bonded hydroxy group and one silicon bonded alkenyl group, siloxane compounds represented by the formula:

[Formula 3]

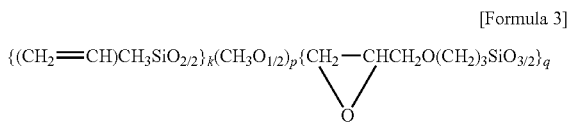

${(CH_2{=}CH)CH_3SiO_{2/2}}_k(CH_3O_{1/2})_p{CH_2{-}CHCH_2O(CH_2)_3SiO_{3/2}}_q$ (where <<k>>, <<p>>, and <<q>> are positive numbers), siloxane compounds represented by the formula:

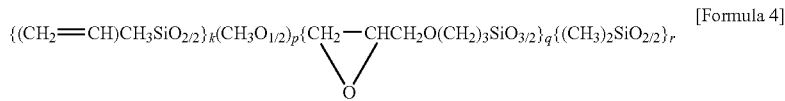

[Formula 4]

(where <<k>>, <<p>>, <<q>>, and <<r>> are positive numbers), methyl polysilicate, ethyl polysilicate, and epoxy-containing ethyl polysilicate. Such adhesion promoters are preferably liquids of low viscosity and while there are no limitations on their viscosity, it is preferably in the range of from 1 to 500 mPa·s at 25° C. In addition, although there are no limitations on the content of the adhesion promoter in the above-mentioned composition, it is preferably in the range of from 0.01 to 10 parts by weight relative to 100 parts by weight of the total of component (A) and component (B).

In addition, so long as this does not impair the purpose of this invention, the present composition may contain silica, glass, alumina, zinc oxide, and other inorganic fillers; micropowders of organic resins such as polymethacrylate resin; heat-stabilizers, dyes, pigments, flame retardants, solvents, etc. as optional components.

It is preferable that, for visible light with a wavelength of 589 nm, the refractive index at 25° C. of the cured product obtained by curing this composition should be not less than 1.5. The light transmittance at 25° C. of the cured product obtained by curing the present composition is preferably not less than 80%. This is due to the fact that it may not be possible to impart sufficient reliability to a semiconductor device having semiconductor elements coated with a cured product of the composition if the refractive index of the cured product is less than 1.5 and its light transmittance is less than 80%. In order to obtain a curable organopolysiloxane composition capable of producing a cured product with a large refractive index and a high light transmittance, it is preferable to make the refractive indices of all the components, from component (A) through component (D), practically the same. More specifically, for component (A), it is preferable to use an organopolysiloxane, in which the content of silicon bonded aryl groups among all the silicon bonded organic groups is not less than 40%, and preferably, not less than 45%, and in which silicon bonded organic groups other than the aryl groups and alkenyl groups are alkyl groups, in particular, methyl groups; also, for component (B), it is preferable to use an organopolysiloxane, in which the content of silicon bonded aryl groups among all the silicon bonded organic groups is not less than 10% and in which silicon bonded organic groups other than the aryl groups and alkenyl groups are alkyl groups, in particular, methyl groups; and, furthermore, for component (C) and component (E), it is preferable to use organopolysiloxanes, in which the content of silicon bonded aryl groups among all the silicon bonded groups is not less than 10% and in which silicon bonded organic groups other than the aryl groups are alkyl groups, in particular, methyl groups. In addition, the determination of the refractive index can be performed, for instance, using an Abbe refractometer. At such time, the refractive index can be determined for an arbitrary wavelength by varying the wavelength of the optical source of the Abbe refractometer. In addition, the refractive index can be obtained, for instance, by using a spectrophotometer to measure a piece of the cured product with an optical path length of 1.0 mm.

In addition, at the wavelength of from 200 nm to 250 nm, the cured product obtained by curing the present composition preferably has a UV transmittance at 25° C. of not more than 10%. This is due to the fact that when a semiconductor device whose semiconductor elements are coated with the cured product of the present composition is subjected to UV irradiation at short wavelengths of from 200 nm to 250 nm, it may be impossible to prevent the degradation of the materials used to make the semiconductor device. The UV transmittance can be obtained, for instance, by using a spectrophotometer to measure a piece of the cured product with an optical path length of 1.0 mm.

The present composition can be cured either at room temperature or under heating, but it is preferable to heat it in order cure it quicker. The temperature, to which it should be heated is preferably at the temperature in the range of from 50 to 200° C. The cured product obtained by curing the present composition in this manner has an elastomer-like appearance, in particular, a gel-like or soft rubber-like appearance. Such a composition can be used as an underfiller, protective coating agent, potting agent, or adhesive agent for electric and electronic products and, because of its high light transmittance, it is particularly suitable for use as an underfiller, protective coating agent, potting agent, or adhesive agent in semiconductor elements used for optical applications.

Next, detailed explanations will be provided regarding the semiconductor device of the present invention.

The present device is characterized in that its semiconductor elements are coated with the cured product of the above-described curable organopolysiloxane composition. Such semiconductor elements are exemplified by semiconductor elements used in diodes, transistors, thyristors, solid-state image pickup elements, monolithic ICs and in hybrid ICs. In addition, such semiconductor devices are exemplified by diodes, light-emitting diodes (LEDs), transistors, thyristors, photocouplers, CCDs, monolithic ICs, hybrid ICs, LSIs, and VLSIs. In particular, due to its high light transmittance, it is preferably used in light-emitting elements such as photocouplers and LEDs.

A cross-sectional view of a photocoupler is illustrated in FIG. 1 as an example of the present device. The photocoupler illustrated in FIG. 1 consists of a semiconductor element 1, which is made up of a compound semiconductor and is die bonded to a lead frame 2. The element is also wire bonded to another lead frame 2 (not shown) using a bonding wire 3. In addition, a light-receiving semiconductor element 4, which is located so as to face semiconductor element 1, is die bonded to a lead frame 5 and wire bonded to another lead frame 5 (not shown) using a bonding wire 6. The space between the semiconductor elements is filled with cured product 7 of the curable organopolysiloxane composition of the present invention. Furthermore, the semiconductor elements coated with the cured product 7 are resin-sealed with sealing resin 8.

To fabricate the photocoupler illustrated in FIG. 1, a semiconductor element 1 is die bonded to a lead frame 2, whereupon the semiconductor element 1 is wire bonded to another lead frame 2 (not shown) using a gold bonding wire 3. In the same manner, a light-receiving semiconductor element 4 is die bonded to a lead frame 5 in a location facing semiconductor element 1, whereupon the semiconductor element 4 is wire bonded to another lead frame 5 (not shown) using a gold bonding wire 6. Next, after filling the space between the semiconductor elements with the curable organopolysiloxane composition of the present invention, it is cured by heating it at the range of from 50 to 200° C. After that, the semiconductor elements coated with the cured product 7 of the above-mentioned curable organopolysiloxane composition are resin-sealed using white epoxy resin 8.

Figure 2:
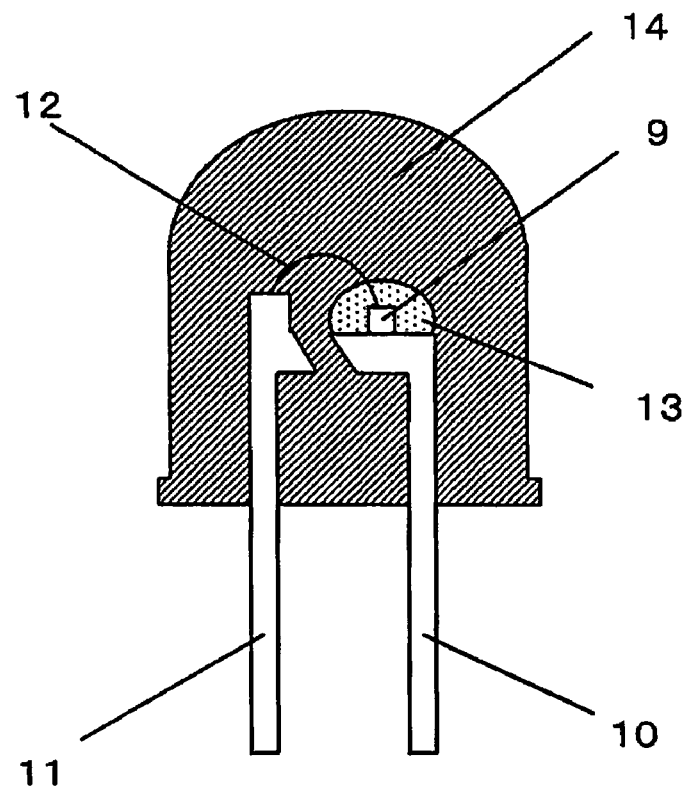
FIG. 2 contains a cross-sectional view of an LED as an example of the semiconductor device of the present invention.

In addition, FIG. 2 shows a cross-sectional view of a single LED as an example of the present device. The LED illustrated in FIG. 2 consists of a semiconductor element 9 die bonded to a lead frame 10, with the semiconductor element 9 wire bonded to another lead frame 11 with a bonding wire 12. The semiconductor element 9 is coated with the cured product 13 of the curable organopolysiloxane composition of the present invention containing 10 wt % of luminescent material (YAG, yttrium-aluminum-garnet). Furthermore, the semiconductor element 9 coated with the cured product 13 is also resin-sealed using the same curable organopolysiloxane composition 14 as the one used for 13 (but it does not contain the luminescent material).

To fabricate the LED illustrated in FIG. 2, the semiconductor element 9 is die bonded to lead frame 10, and then the semiconductor element 9 is wire bonded to lead frame 11 using a gold bonding wire 12. Next, after coating the semiconductor element 9 with the curable organopolysiloxane composition of the present invention, it is cured by heating it at the temperature in the range of from 50 to 200° C. After that, the semiconductor element 9 coated with the cured product 13 of the above-mentioned curable organopolysiloxane composition is resin-sealed using the same curable organopolysiloxane composition 14 as the one used for 13.

EXAMPLES

The curable organopolysiloxane composition and semiconductor device of the present invention will be now explained in detail by referring to application examples. Please note that the term "viscosity", as used in the application examples, refers to values obtained at 25° C. Also, the characteristics of the curable organopolysiloxane composition and its cured product were determined as follows.

[Filling Properties of Curable Organopolysiloxane Composition]

A polyethylene sheet with 100 square protrusions with a width of 1 mm×1 mm and a depth of 2 mm, which were spaced apart at an interval of 1 mm, was used for the test. The indentations were filled with the curable organopolysiloxane composition from a dispenser. When the curable organopolysiloxane composition filled all the indentations properly, without spreading to adjacent indentations, the quality of filling was designated as ○. When there were 1 to 5 unfilled positions, it was designated as Δ, and when there were more than 6 unfilled positions, it was designated as ×.

[Curability of Curable Organopolysiloxane Composition]

A value obtained by dividing the needle penetration score according to JIS K 2220 of a cured product obtained by curing the curable organopolysiloxane composition by heating for 12 hours in a hot air circulating oven at 150° C. by the needle penetration score of a cured product obtained by curing the above-mentioned composition in a hot air circulating oven at 120° C. for 1 hour was used as an index of curability. In addition, the closer the value was to 1, the better the curability of the curable organopolysiloxane composition was.

[Needle Penetration Score of the Cured Product]

A cured product was obtained by curing the curable organopolysiloxane composition in a hot air circulating oven at 120° C. for 1 hour. To determine the needle penetration score, the cured product was tested in accordance with JIS K 2220.

[Refractive Index of the Cured Product]

The refractive index of a cured product produced by curing the curable organopolysiloxane composition in a hot air circulating oven at 120° C. for 1 hour was measured at 25° C. using an Abbe refractometer. Visible light with a wavelength of 589 nm was used as the optical source used for the measurements.

[Light Transmittance of the Cured Product]

The light transmittance of a cured product (optical path length: 1.0 mm) produced by curing the curable organopolysiloxane composition in a hot air circulating oven at 120° C. for 1 hour was measured using visible light with a wavelength of 420 nm.

[Adhesive Properties of the Cured Product]

After evaluation conducted by performing evaluation test (2) described below, the semiconductor device was examined under a microscope to evaluate the adhesion of the cured product of curable silicone to transparent epoxy resin. The quality of adhesion was designed as × when gaps were present, as Δ when the interface was clearly visible, and as ○ when the interface was unclear.

In addition, the reliability of the semiconductor device was evaluated as follows.

[Semiconductor Device Reliability Evaluation Method (1)]

The photocoupler illustrated in FIG. 1 was fabricated as follows. Namely, a Ga—Al—As compound-based semiconductor element 1 was die bonded to a lead frame 2 using electrically conductive paste, whereupon the semiconductor element 1 was wire bonded to another lead frame 2 (not shown) using a gold bonding wire 3. Using electrically conductive paste, a light-receiving semiconductor element 4 was die bonded to a lead frame 5 in a position where it was facing semiconductor element 1, whereupon the semiconductor element 4 was wire bonded to another lead frame 5 (not shown) using a gold bonding wire 6. After filling the space between the semiconductor elements with the curable organopolysiloxane composition, it was cured by heating for 1 hour in a hot air circulating oven at 150° C. Next, the semiconductor elements coated with the cured product 7 of the curable organopolysiloxane composition were resin-sealed using white epoxy resin 8. Ten photocouplers were fabricated in the above-described manner. The light-emitting output of these photocouplers was measured prior to and after heat treating them for 100 hours in a hot air circulating oven at 150° C., and the reliability of the devices was expressed as a mean of relative values of their light-emitting output after the heat treatment, with the level of light-emitting output prior to the heat treatment considered as 100.

[Semiconductor Device Reliability Evaluation Method (2)]

The LED illustrated in FIG. 2 was fabricated as follows. Namely, a GaN compound semiconductor element 9 was die bonded to a lead frame 10 using electrically conductive paste, whereupon the semiconductor element 9 was wire bonded to another lead frame 11 using a gold bonding wire 12. Next, after coating the semiconductor element 9 with the curable organopolysiloxane composition, it was cured by heating for 1 hour in a hot air circulating oven at 150° C. The semiconductor element 9 coated with the cured product 13 of the curable organopolysiloxane composition was resin-sealed with transparent epoxy resin 14. Ten LEDs were fabricated in the above-described manner.

The light-emitting output of these LEDs was measured prior to and after heat treating them for 100 hours in a hot air circulating oven at 150° C., and the reliability of the devices was expressed as a mean of relative values of their light-emitting output after the heat treatment, with the level of light-emitting output prior to the heat treatment considered as 100.

APPLICATION EXAMPLE 1

A curable organopolysiloxane composition with a viscosity of 1,700 mPa·s was prepared by uniformly mixing 55 parts by weight of a linear methylphenylpolysiloxane with a viscosity of 3,500 mPa·s having both ends of the molecular chain blocked by dimethylvinylsiloxy groups (content of silicon bonded vinyl groups=0.20 wt %, percentage of silicon bonded phenyl groups in all silicon bonded organic groups=49 mol %), 45 parts by weight of a branched organopolysiloxane represented by the average unit formula:

$(C_6H_5SiO_{3/2})_{0.75}[(CH_2=CH)(CH_3)_2SiO_{1/2}]_{0.25}$

{consistency at 25° C.=solid, percentage of silicon bonded vinyl groups in all silicon bonded organic groups=17 mol %, percentage of silicon bonded phenyl groups in all silicon bonded organic groups=50 mol %, weight-average molecular weight, as converted to standard polystyrene=1,600}, 24 parts by weight of a methylphenylpolysiloxane having both ends of the molecular chain blocked by diimethylhydrogensiloxy groups, represented by the formula:

$H(CH_3)_2SiO[CH_3(C_6H_5)SiO]_4Si(CH_3)_2H$, a complex of platinum and 1,3-divinyl-1,1,3,3-tetramethyldisiloxane (an amount necessary to provide, in weight units, 2.5 ppm of platinum metal from the complex in the present composition), and 0.05 parts by weight of 2-phenyl-3-butyn-2-ol.

The characteristics of the curable organopolysiloxane composition and its cured product were measured. The results were listed in Table 1. In addition, photocouplers and LEDs were fabricated using the curable organopolysiloxane composition. The reliability evaluation results for the semiconductor devices were listed in Table 1.

APPLICATION EXAMPLE 2

A curable organopolysiloxane composition with a viscosity of 1,860 mPa·s was prepared by uniformly mixing 55 parts by weight of a linear methylphenylpolysiloxane with a viscosity of 3,500 mPa·s having both ends of the molecular chain blocked by dimethylvinylsiloxy groups (content of silicon bonded vinyl groups=0.20 wt %, percentage of silicon bonded phenyl groups in all silicon bonded organic groups=49 mol %), 45 parts by weight of a branched organopolysiloxane represented by the average unit formula:

$(C_6H_5SiO_{3/2})_{0.75}[(CH_2=CH)(CH_3)_2SiO_{1/2}]_{0.25}$

{consistency at 25° C.=solid, percentage of silicon bonded vinyl groups in all silicon bonded organic groups=17 mol %, percentage of silicon bonded phenyl groups in all silicon bonded organic groups=50 mol %, weight-average molecular weight, as converted to standard polystyrene=1,600}, 22 parts by weight of a methylphenylpolysiloxane having both ends of the molecular chain blocked by dimethylhydrogensiloxy groups, represented by the formula:

$H(CH_3)_2SiO[CH_3(C_6H_5)SiO]_4Si(CH_3)_2H$, 1 parts by weight of a branched organopolysiloxane with a viscosity of 950 mPa·s, represented by the average unit formula:

$(C_6H_5SiO_{3/2})_{0.60}[(CH_3)_2HSiO_{1/2}]_{0.40}$ (percentage of silicon bonded hydrogen atoms in all silicon bonded groups=22 mol %, percentage of silicon bonded phenyl groups in all silicon bonded groups=33 mol %, weight-average molecular weight, as converted to standard polystyrene=1,100), 0.1 parts by weight of a siloxane compound used as a tackifier, represented by the average unit formula:

$$\{(CH_2=CH)CH_3SiO_{2/2}\}_3(CH_3O_{1/2})_5\{CH_2-CHCH_2O(CH_2)_3SiO_{3/2}\}_5\{(CH_3)_2SiO_{2/2}\}_{20} \quad \text{[Formula 5]}$$
$$\underset{O}{\diagdown\diagup}$$

a complex of platinum and 1,3-divinyl-1,1,3,3-tetramethyldisiloxane (an amount necessary to provide, in weight units, 2.5 ppm of platinum metal from the complex in the present composition), and 0.05 parts by weight of 2-phenyl-3-butyn-2-ol.

The characteristics of the curable organopolysiloxane composition and its cured product were measured. The results were listed in Table 1. In addition, photocouplers and LEDs were fabricated using the curable organopolysiloxane composition. The reliability evaluation results for the semiconductor devices were listed in Table 1.

COMPARATIVE EXAMPLE 1

A curable organopolysiloxane composition with a viscosity of 2,460 mPa·s was prepared by uniformly mixing 55 parts by weight of a linear methylphenylpolysiloxane with a viscosity of 3,500 mPa·s having both ends of the molecular chain blocked by dimethylvinylsiloxy groups (content of silicon bonded vinyl groups=0.20 wt %, percentage of silicon bonded phenyl groups in all silicon bonded organic groups=49 mol %), 45 parts by weight of a branched organopolysiloxane represented by the average unit formula:

$(C_6H_5SiO_{3/2})_{0.75}[(CH_2=CH)(CH_3)_2SiO_{1/2}]_{0.25}$

{consistency at 25° C.=solid, percentage of silicon bonded vinyl groups in all silicon bonded organic groups=17 mol %, percentage of silicon bonded phenyl groups in all silicon bonded organic groups=50 mol %, weight-average molecular weight, as converted to standard polystyrene=1,600}, 24 parts by weight of a dimethylpolysiloxane represented by the formula:

$H(CH_3)_2SiO[(CH_3)_2SiO]_4Si(CH_3)_2H$, a complex of platinum and 1,3-divinyl-1,1,3,3-tetramethyldisiloxane (an amount necessary to provide, in weight units, 2.5 ppm of platinum metal from the complex in the present composition), and 0.05 parts by weight of 2-phenyl-3-butyn-2-ol.

The characteristics of the curable organopolysiloxane composition and its cured product were measured. The results were listed in Table 1. In addition, photocouplers and LEDs were fabricated using the curable organopolysiloxane composition. The reliability evaluation results for the semiconductor devices were listed in Table 1.

COMPARATIVE EXAMPLE 2

A curable organopolysiloxane composition with a viscosity of 3,500 mPa·s was prepared by uniformly mixing 55 parts by weight of a linear methylphenylpolysiloxane with a viscosity of 3,500 mPa·s having both ends of the molecular chain blocked by dimethylvinylsiloxy groups (content of silicon bonded vinyl groups=0.20 wt %, percentage of silicon bonded phenyl groups in all silicon bonded organic groups=49 mol %), 45 parts by weight of a branched organopolysiloxane represented by the average unit formula:

$(C_6H_5SiO_{3/2})_{0.75}[(CH_2=CH)(CH_3)_2SiO_{1/2}]_{0.25}$

{consistency at 25° C.=solid, percentage of silicon bonded vinyl groups in all silicon bonded organic groups=17 mol %, percentage of silicon bonded phenyl groups in all silicon bonded organic groups=50 mol %, weight-average molecular weight, as converted to standard polystyrene=1,600}, 12 parts by weight of a branched organopolysiloxane with a viscosity of 950 mPa·s, represented by the average unit formula:

$(C_6H_5SiO_{3/2})_{0.60}[(CH_3)_2HSiO_{1/2}]_{0.40}$ (percentage of silicon bonded hydrogen atoms in all silicon bonded groups=22 mol %, percentage of silicon bonded phenyl groups in all silicon bonded groups=33 mol %, weight-average molecular weight, as converted to standard polystyrene=1,100), a complex of platinum and 1,3-divinyl-1,1,3,3-tetramethyldisiloxane (an amount necessary to provide, in weight units, 2.5 ppm of platinum metal from the complex in the present composition), and 0.05 parts by weight of 2-phenyl-3-butyn-2-ol.

The characteristics of the curable organopolysiloxane composition and its cured product were measured. The results were listed in Table 1. In addition, photocouplers and LEDs were fabricated using the curable organopolysiloxane composition. The reliability evaluation results for the semiconductor devices were listed in Table 1.

COMPARATIVE EXAMPLE 3

A curable organopolysiloxane composition with a viscosity of 3,100 mPa·s was prepared by uniformly mixing 100 parts by weight of a linear methylphenylpolysiloxane with a viscosity of 3,500 mPa·s having both ends of the molecular chain blocked by dimethylvinylsiloxy groups (content of silicon bonded vinyl groups=0.20 wt %, percentage of silicon bonded phenyl groups in all silicon bonded organic groups=49 mol %), 18 parts by weight of a methylphenylpolysiloxane having both ends of the molecular chain blocked by dimethylhydrogensiloxy groups, represented by the formula:

$H(CH_3)_2SiO[CH_3(C_6H_5)SiO]_4Si(CH_3)_2H$, a complex of platinum and 1,3-divinyl-1,1,3,3-tetramethyldisiloxane (an amount necessary to provide, in weight units, 2.5 ppm of platinum metal from the complex in the present composition), and 0.05 parts by weight of 2-phenyl-3-butyn-2-ol.

The characteristics of the curable organopolysiloxane composition and its cured product were measured. The results were listed in Table 1. In addition, photocouplers and LEDs were fabricated using the curable organopolysiloxane composition. The reliability evaluation results for the semiconductor devices were listed in Table 1.

COMPARATIVE EXAMPLE 4

A curable organopolysiloxane composition with a viscosity of 7,800 mPa·s was prepared by uniformly mixing 100 parts by weight of a branched organopolysiloxane represented by the average unit formula:

$(C_6H_5SiO_{3/2})_{0.75}[(CH_2=CH)(CH_3)_2SiO_{1/2}]_{0.25}$

{consistency at 25° C.=solid, percentage of silicon bonded vinyl groups in all silicon bonded organic groups=17 mol %, percentage of silicon bonded phenyl groups in all silicon bonded organic groups=50 mol %, weight-average molecular weight, as converted to standard polystyrene=1,600}, 25 parts by weight of a methylphenylpolysiloxane having both ends of the molecular chain blocked by dimethylhydrogensiloxy groups, represented by the formula:

$H(CH_3)_2SiO[CH_3(C_6H_5)SiO]_4Si(CH_3)_2H$, a complex of platinum and 1,3-divinyl-1,1,3,3-tetramethyldisiloxane (an amount necessary to provide, in weight units, 2.5 ppm of platinum metal from the complex in the present composition), and 0.05 parts by weight of 2-phenyl-3-butyn-2-ol.

The characteristics of the curable organopolysiloxane composition and its cured product were measured. The results were listed in Table 1. In addition, photocouplers and LEDs were fabricated using the curable organopolysiloxane composition. The reliability evaluation results for the semiconductor devices were listed in Table 1.

TABLE 1

| | | Application Examples | | Comparative Examples | | | |
|---|---|---|---|---|---|---|---|
| Items | | 1 | 2 | 1 | 2 | 3 | 4 |
| Curable organopolysiloxane composition | Filling properties | ○ | ○ | ○ | Δ | ○ | x |
| | Curability | 1.0 | 0.9 | 0.6 | 0.5 | 0.8 | 0.5 |
| Cured product | Needle penetration | 77 | 75 | 70 | 55 | 51 | 60 |
| | Light transmittance (%) | 100 | 100 | 72 | 92 | 92 | 92 |
| | Refractive index | 1.54 | 1.53 | 1.48 | 1.54 | 1.51 | 1.53 |
| | Adhesion to epoxy resin | ○ | ○ | x | ○ | x | Δ |

TABLE 1-continued

| | | Type | | | | | |
|---|---|---|---|---|---|---|---|
| | | Application Examples | | Comparative Examples | | | |
| Items | | 1 | 2 | 1 | 2 | 3 | 4 |
| Semiconductor device reliability | Evaluation (No. 1) Relative value of light output (%) | 100 | 100 | 55 | 87 | 85 | 53 |
| | Evaluation (No. 2) Relative value of light output (%) | 100 | 98 | 49 | 75 | 78 | 48 |

INDUSTRIAL APPLICABILITY

The curable organopolysiloxane composition of the present invention can be used as an underfiller, protective coating agent, potting agent, or adhesive agent for electric and electronic products, and, because of its high light transmittance, it is particularly suitable for use as an underfiller, protective coating agent, potting agent, or adhesive agent in semiconductor elements used for optical applications. In addition, the semiconductor device of the present invention is suitable for use in diodes, light-emitting diodes (LEDs), transistors, thyristors, photocouplers, CCDs, monolithic ICs, hybrid ICs, LSIs, and VLSIs.

The invention claimed is:

1. A curable organopolysiloxane composition comprising;
   (A) a linear organopolysiloxane having at least two silicon bonded alkenyl groups and at least one silicon bonded aryl group per molecule, in which the content of the silicon bonded aryl groups relative to all the silicon bonded organic groups in component (A) is not less than 40 mol %,
   (B) a branched organopolysiloxane having at least one silicon bonded alkenyl group and at least one silicon bonded aryl group per molecule, and having siloxane units represented by the general formula:

RSiO$_{3/2}$, where R is a substituted or unsubstituted monovalent hydrocarbon group and where component (B) is present in an amount necessary for a weight ratio of from 1/99 to 99/1 relative to component (A),
   (C) a linear organopolysiloxane with both terminal ends of the molecular chain blocked by silicon bonded hydrogen atoms having at least one silicon bonded aryl group per molecule, where component (C) is present in an amount necessary to provide 1 to 200 parts by weight relative to 100 parts by weight of the total of component (A) and component (B), and
   (D) a hydrosilation reaction catalyst present in an amount necessary to promote the curing of the present composition.

2. The curable organopolysiloxane composition according to claim 1, in which component (A) is an organopolysiloxane represented by the general formula:

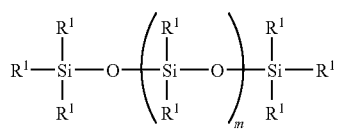

where $R^1$ is a substituted or unsubstituted monovalent hydrocarbon group with at least two $R^1$ being alkenyl groups and at least one $R^1$ being an aryl group, and <<m>> is an integer of 5 to 1000.

3. The curable organopolysiloxane composition according to claim 1, in which component (B) is an organopolysiloxane represented by the average unit formula:

$(R^2SiO_{3/2})_a(R^2{}_2SiO_{2/2})_b(R^2{}_3SiO_{1/2})_c(SiO_{4/2})_d(XO_{1/2})_e$ where $R^2$ is a substituted or unsubstituted monovalent hydrocarbon group with the range of from 0.1 to 40 mol % of $R^2$ constituted by alkenyl groups and not less than 10 mol % of $R^2$ constituted by aryl groups, X is a hydrogen atom or alkyl group, <<a>> is a positive number, <<b>> is 0 or a positive number, <<c>> is 0 or a positive number, <<d>> is 0 or a positive number, <<e>> is 0 or a positive number, <<b/a>> is a number between 0 and 10, <<c/a>> is a number between 0 and 0.5, <<d/(a+b+c+d)>> is a number between 0 and 0.3, and <<e/(a+b+c+d)>> is a number between 0 and 0.4.

4. The curable organopolysiloxane composition according to claim 1, in which component (C) is an organopolysiloxane represented by the general formula:

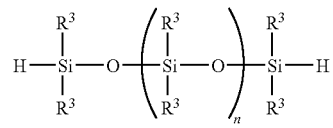

where $R^3$ is a hydrogen atom or a substituted or unsubstituted monovalent hydrocarbon group with the exception of alkenyl groups and at least one $R^3$ is an aryl group, and <<n>> is an integer of 1 or more.

5. The curable organopolysiloxane composition according to claim 1, which cures to form a cured product with a refractive index at 25° C. of 1.5 or more for visible light with a wavelength of 589 nm.

6. The curable organopolysiloxane composition according to claim 1, which cures to form a cured product with a light transmittance at 25° C. of not less than 80%.

7. The curable organopolysiloxane composition according to claim 1, which cures to form a cured product with a needle penetration score of not less than 5.

8. A semiconductor device, in which semiconductor elements are coated with a cured product of the curable organopolysiloxane composition according to claim 1.

9. The semiconductor device according to claim 8, in which the semiconductor elements are light-emitting elements.

10. A semiconductor device, in which semiconductor elements are coated with a cured product of the curable organopolysiloxane composition according to claim 2.

11. A semiconductor device, in which semiconductor elements are coated with a cured product of the curable organopolysiloxane composition according to claim 3.

12. A semiconductor device, in which semiconductor elements are coated with a cured product of the curable organopolysiloxane composition according to claim 4.

* * * * *